(12) United States Patent
Wu

(10) Patent No.: US 7,372,307 B1
(45) Date of Patent: May 13, 2008

(54) EFFICIENT CURRENT MONITORING FOR DC-DC CONVERTERS

(75) Inventor: Dolly Y. Wu, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/470,130

(22) Filed: Sep. 5, 2006

Related U.S. Application Data

(63) Continuation of application No. 10/838,099, filed on May 3, 2004, now abandoned.

(51) Int. Cl.
  *G11C 27/02* (2006.01)
  *H03K 5/153* (2006.01)
(52) U.S. Cl. ............... 327/96; 327/89; 341/122
(58) Field of Classification Search ............ None
  See application file for complete search history.

(56) References Cited

U.S. PATENT DOCUMENTS

| | | | |
|---|---|---|---|
| 5,245,223 A | 9/1993 | Lim et al. | |
| 6,008,673 A | 12/1999 | Glass et al. | |
| 6,046,612 A | 4/2000 | Taft | |
| 6,066,944 A * | 5/2000 | Sakurai | 323/315 |
| 6,124,732 A | 9/2000 | Zilic et al. | |
| 6,147,518 A | 11/2000 | Hughes | |
| 6,396,329 B1 | 5/2002 | Zerbe | |
| 6,847,234 B2 | 1/2005 | Choi | |
| 6,940,316 B2 * | 9/2005 | Wakamatsu et al. | 327/57 |

* cited by examiner

*Primary Examiner*—N. Drew Richards
*Assistant Examiner*—Terry L. Englund
(74) *Attorney, Agent, or Firm*—Dolly Y. Wu; W. James Brady; Frederick J. Telecky, Jr.

(57) ABSTRACT

A current monitoring circuit for DC-DC switching converters includes a track and latch comparator circuit (30) having a preamplifier (32) that is controlled independently of a latch circuit (34). The comparator is small and operates very fast and with improved sensitivity. For example, the preamplifier circuit is disabled when the latch stage is making its decision to avoid noise and input disturbances from affecting the latch stage. This selective disabling feature speeds up the signal processing of the comparator and allows it to work in parallel with other circuits. The latch stage can make its decision later, regardless of any further activity at the inputs of the comparator.

23 Claims, 4 Drawing Sheets

EFFICIENT CURRENT MONITORING FOR DC-DC CONVERTERS

CROSS-REFERENCES TO RELATED APPLICATIONS

This is a continuation of application Ser. No. 10/838,099, now abandoned, and claims the priority benefit of that application.

FIELD OF THE INVENTION

The present invention is generally related to DC-DC switching converters, and more particularly to current monitoring of these converters.

BACKGROUND OF THE INVENTION

Current monitoring and overcurrent trip circuits are typically used in high current voltage regulation IC's, including DC-DC switching converters. These circuits protect the IC, and/or the other circuits to which the regulator is supplying current, in applications such as computers, communications, and industrial machinery. Without over current monitoring, both the switching regulator itself and the circuits powered by the regulator may overheat and collapse when there is too much current being supplied to the load.

In a conventional DC-DC converter, a switching transistor (switches) is turned ON to pass a noisy input voltage to the output as a quiet, well regulated output voltage that is sourcing a large current. This current may be monitored a number of ways. A typical current monitor circuit has a current sensing element which provides an associated voltage signal that is sent to a comparator stage to decide whether the voltage signal is higher than some reference (voltage) value that is representative of an over-current threshold. The comparison is often made only after a certain time interval that allows signals to settle, known as the blanking time interval.

FIG. 1 shows a typical timing diagram for the blanking time and a pulse (PH) which controls a conventional DC-DC switcher, turning it on and off to pass or restrict current to the load. There are several cases, 1A-1C. FIG. 1A with a long PH (switcher ON) time interval case allows the current limit circuit much time after the blanking period, to operate and make a decision. However, cases 1B and 1C give the current limiting circuit very little time to operate and make a decision. This circumstance occurs when the switching cycle is very fast, and the switcher is ON only briefly.

FIG. 2a shows a prior art example of a "continuous time" high speed comparator that may be used as part of a current limiting circuit, similar to those used in many Texas Instruments DC-DC converter products.

FIG. 2b shows a discrete time current comparator, such as described in U.S. Pat. No. 6,147,518, that switches currents. The decision is made on the edge of an enable control signal.

FIG. 3 shows a block diagram of a conventional "track and latch" comparator architecture adapted to be used in data converters. A preamplifier is selectively enabled by a clock signal, and its output "tracks" the input while the second latch stage is simultaneous disabled and is controlled by the same clock signal. During the latch mode, starting at the rising edge of the clock signal, the latch stage is enabled and regeneratively amplifies the output of the preamplifier with nearly infinite gain (i.e. a decision will be made regardless), producing and holding the output logic decision.

SUMMARY OF THE INVENTION

The present invention achieves technical advantages as a current monitoring circuit for DC-DC switching converters, including a track and latch comparator circuit having a preamplifier that is controllable independently of a latch circuit. Advantageously, the preamplifier circuit can be disabled when the latch stage is making its decision, such as to avoid noise and input disturbances from affecting the latch stage. This selective disabling feature also speeds up the signal processing of the overall comparator, and allows it to work in parallel with other circuits. The latch stage can make its decision later, regardless of any further activity at the inputs of the comparator.

Alternatively, the preamplifier need not be disabled while the latch is enabled, depending on the system algorithm used to detect over-current conditions. In some situations, it may be better to not disengage the preamplifier stage when the latch stage regenerates and makes its decision. For example, the transistors in the preamplifier may be selectively biased to increase the gain of the preamplifier.

The preamplifier includes transistors that may be configured as cascodes, but which also may be selectively deactivated. When operating as cascodes, the transistors reduce the Miller capacitance seen at the inputs of the comparator and also reduce the current kick back to the inputs from switching transistors, thereby improving the processing speed and sensitivity of the comparator.

Advantageously, current in the preamplifier stage may be mirrored, the mirrored current pre-loading the latch stage transistors with current, saving time so that when the rising edge of the latch enabling signal occurs, the latch stage already has started towards making a decision.

The present invention has fewer switching devices at the input of the circuit where it is critical to have quiet circuitry to avoid degrading the input signals. The comparator of the present invention utilizes a technique novel to and optimized for current trip monitoring providing a faster decision circuit, allowing a reduction of the size of an inductor needed at the output of the DC-DC converter and allowing larger input-to-output voltage conversion ratio, when the PH pulse becomes very narrow in width. The present invention is smaller than conventional current limiting circuits with fewer switches and control signals, and has virtually infinite gain and very high sensitivity, even for small differential input voltage over drives.

DETAILED DESCRIPTION OF THE PREFERRED EMBODIMENT

Figure 4:
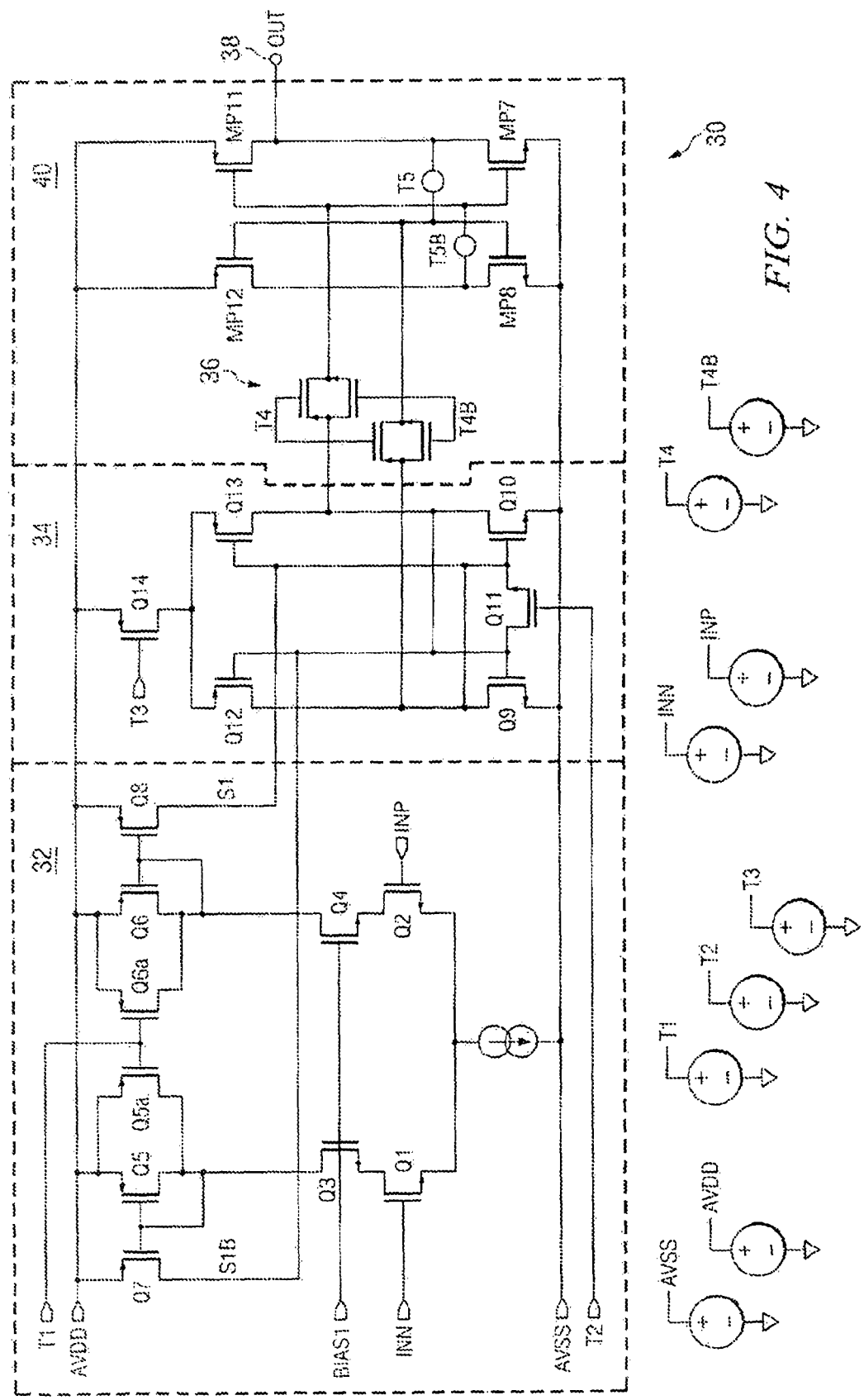
FIG. 4 is a detailed electrical schematic diagram of one preferred embodiment of the present invention comprising a track and latch decision circuit having an individually controllable preamplifier and latch stage.

The present invention comprises an improved "track and latch" decision circuit providing over-current monitoring, whereby the preamplifier and the latch stage are advantageously independently controlled, with one preferred embodiment of the invention shown as a comparator circuit 30 in FIG. 4.

Comparator 30 has two voltage inputs, inp and inn, input to the comparator's preamplifier stage 32 operating as a first stage. One input is formed from the current sensing element, and the other input represents the reference current trip point threshold voltage. A differential current mirror OTA, comprising transistors Q1-Q8 along with a current source bias, is used in the preamplifier stage 32 of a comparator 30 to magnify the difference between the inputs inn and inp. Diode connected load transistors Q5, Q6 are in saturation and keep the node voltage at the drain of the input transistors, Q1 and Q2, of the first stage 32 fairly stationary, allowing high speed operation to the second latch stage 34.

Parallel to the load transistors, Q5 and Q6, are another set of transistors, Q5a and Q6a, which may be used to selectively disable the preamplifier 32 if transistors Q5a and Q6a are turned ON starting on the rising edge of clock T1. The advantage of selectively disabling the first stage 32 when the second latch stage 34 is making its decision is to avoid noise and input disturbances from affecting the latch stage 34. Also, this selective disabling feature speeds up the signal processing of the latch stage 34 and allows the overall comparator 30 to work in parallel with other circuits. The latch stage 34 finishes making its decision later, regardless of any further activity at the inputs of the comparator 30 (i.e. the first stage is disabled; the receiving transistors of the latch are already pre-loaded with current as stated earlier, for the latch stage to finish making its decision).

Alternatively, the preamplifier 32 need not be disabled, and transistors Q5a and Q6a need not be used as switches. This depends on the system algorithm used to detect over current conditions, and whether it is better to disengage the first stage 32 when the latch stage 34 regenerates and makes its decision. If not used as switches, transistors Q5a and Q6a may advantageously be biased to increase the gain of the preamplifier 32 by sourcing additional current from the supply AVDD.

Two optional transistors Q3 and Q4 are provided in the first stage 32 which may be used as cascodes, or deactivated as cascodes by the tying their gates HI via input line bias 1. As cascodes, these transistors reduce the Miller capacitance seen at the inputs and also the kickback to the inputs from the switching transistors Q5a and Q6a, thereby improving the processing speed and sensitivity of comparator 30. The cascode transistors may limit the common mode input voltage range, but a large common mode range is generally not an issue in over current monitoring; so, it's typically better to have the cascode transistors.

The legs transistors Q9 and Q10, of the latch stage 34, are used simultaneously as pull downs for the mirror opamp transistors Q7 and Q8, and also as part of the regenerative latch stage 34 itself. These legs are pre-loaded with currents from the transistors Q7 and Q8 on nodes S1B and S1, respectively, of the preamplifier stage, again saving time, so that when the rising edges of the clocks T2 and T3 occur, the latch stage 34 already has started towards making a decision. When both the upper transistors Q12 and Q13 are ON and the reset transistor Q11 is OFF so that the left and right inverter pairs of the latch are released and no longer shorted together by Q11, then the latch stage 34 can flip and make a decision. The rising edge of the clock T2 activates the release of the latch stage 34 and essentially determines the decision time point. The decision output of this latch stage 34 can then be buffered or sampled onto the next stage 40 or next circuit via output line 38.

Figure 1A:
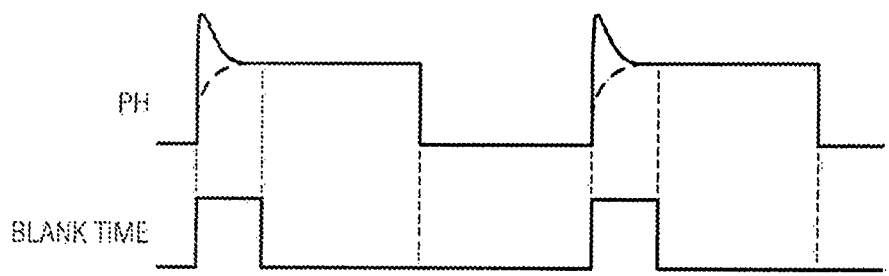
FIGS. 1A-1C are timing diagrams of a blanking time and pulse (PH) signal which control a conventional DC-DC switcher under different conditions.
Figure 1B:
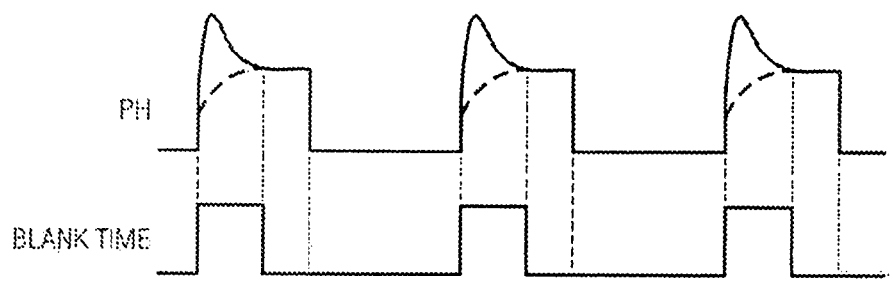
Figure 1C:
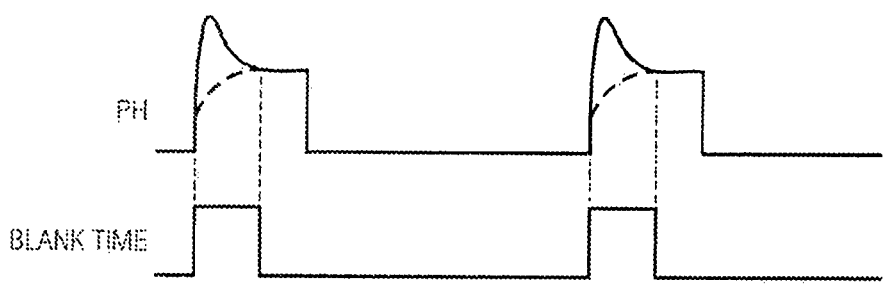
Figure 5:
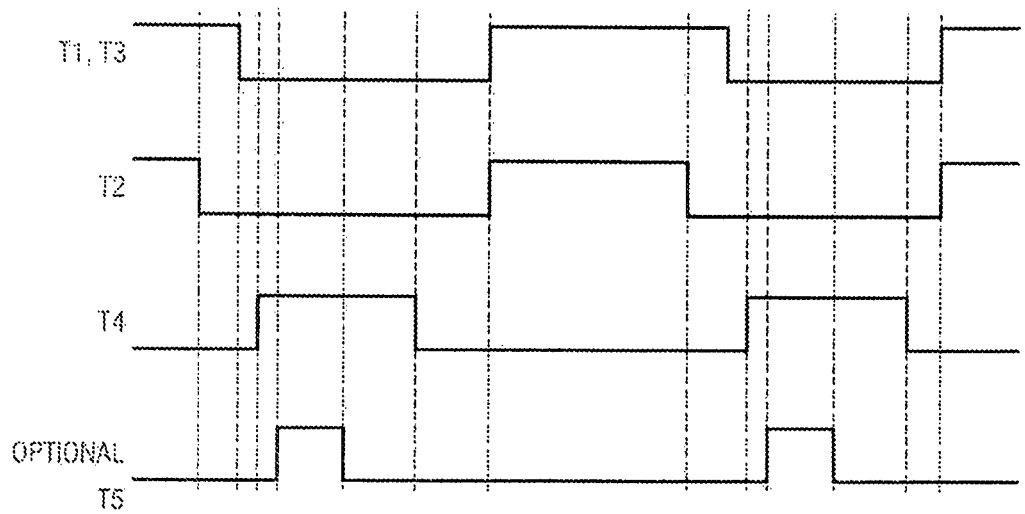
FIG. 5 is a timing diagram for controlling the comparator of the present invention using multiple clock signals.

The optimal timing for when the various clock edges T1, T2, T3 occur depends on the type of switching regulator, the system algorithm used for over current monitoring, and also on the power saving needs or over-drive sensitivity needs of the comparator 30. For example, the clock edges may be the initial/trailing edge of the PH control pulse, the end of the blanking time, or some subsequent time, as shown in FIGS. 1A-1C. When implemented, clock T2 should precede clocks T1 and T3, if the algorithm calls for disabling the preamp stage 32. For simplicity, block T1 may be the same as clock T3. See FIG. 5 for one embodiment of the various timing diagrams for clocks T1, T2, and T3. Switches 36 are controlled by signals T4 and T4B (see FIGS. 4 and 5). The switches isolate the latch 34 from an output buffer stage 40 with a final output 38. The output buffer stage comprises inverters (MP8/MP12 and MP7/MP11) which may be OPTIONAL (LY) cross-coupled by switches (the circles) controlled by T5 and T5B (see FIGS. 4 and 5) so that stage 40 looks and acts like a latch like stage 34 (see FIG. 4).

Figure 2A:
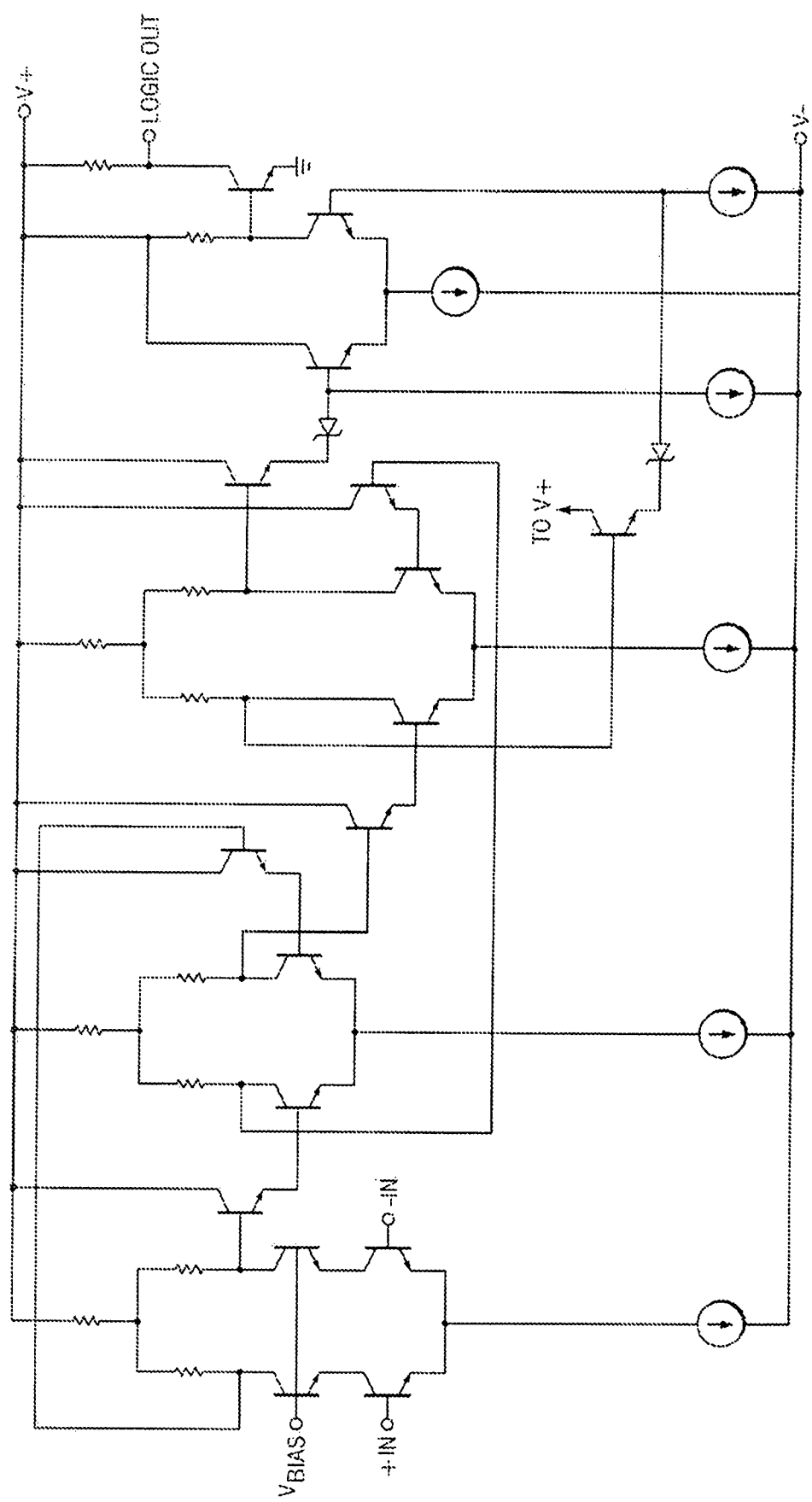
FIG. 2A shows a prior art example of a continuous time high speed comparator.
Figure 2B:
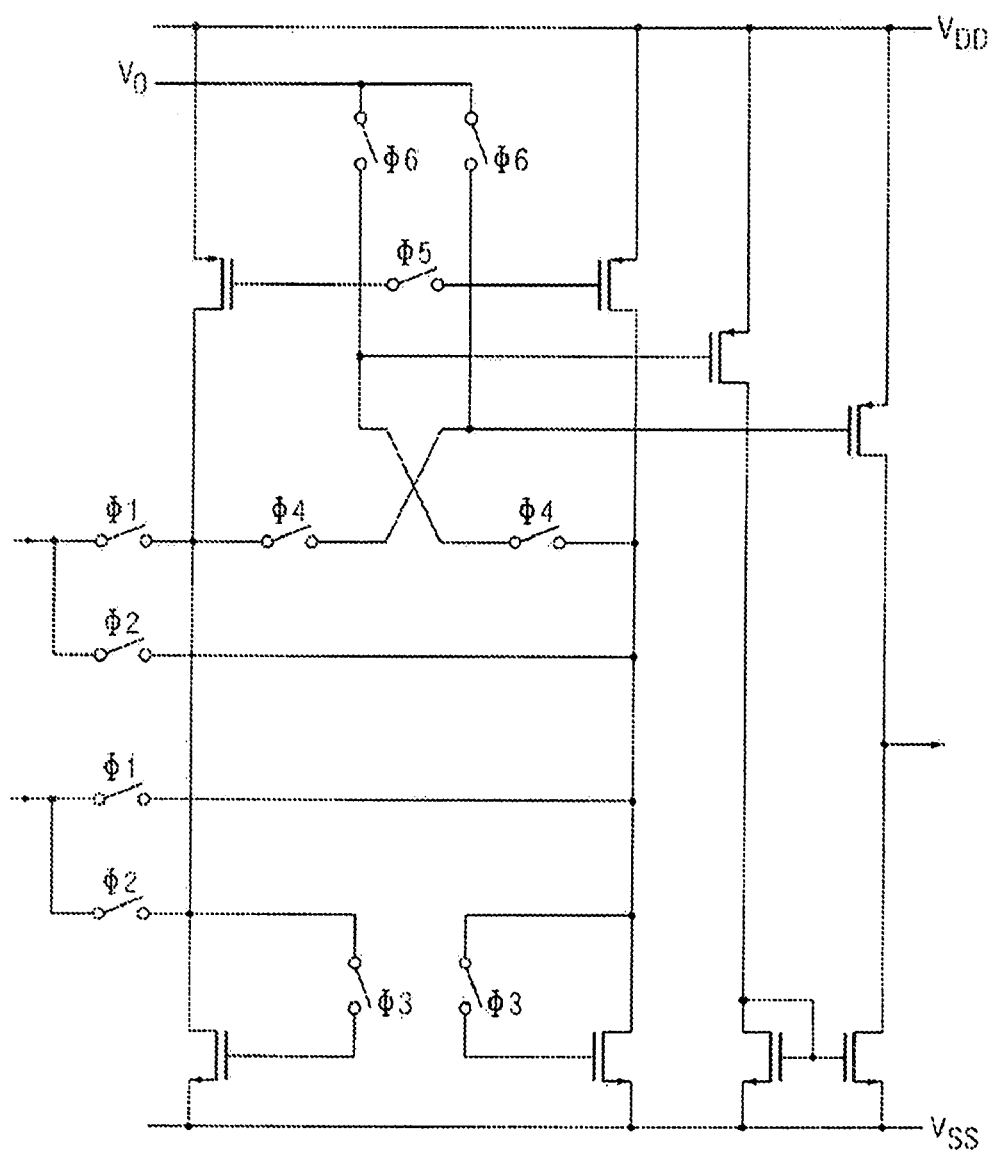
FIG. 2B shows a prior art conventional discreet time current comparator (U.S. Pat. No. 6,147,518)
Figure 3:
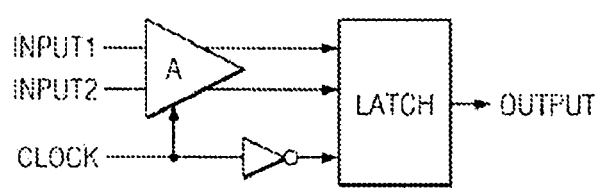
FIG. 3 shows a block diagram of a conventional track and latch architecture adapted to be used in data converters.

Advantageously, the present invention is a track and latch ("discrete" time) circuit instead of the continuous time method usually used. It is also different from the discrete time approach shown in FIG. 2b which takes in current directly, rather than voltage and has many switches and multiple timing controls. In many applications, the current to be sensed is too large to be processed by small circuit elements without destroying them, it is easier to take in voltage signals rather than currents. The present invention avoids clock kickback issues, and has fewer switching devices at the input of the circuit where it is critical to have "quiet" circuitry to avoid degrading the input signals. The gain improvement transistors Q5A and Q6A, and cascode transistors Q3 and Q4, technique help improve sensitivity over prior art of FIG. 2B.

The over current trip circuit part of a switching voltage regulator (DC-DC converter) is generally the circuit which limits the speed at which the regulator can operate. This occurs when the PH pulse is very narrow, when the flat portion of PH is ON for only a short time duration. For example, if a DC-DC converter is made to switch faster to reduce the inductor size and cost, or if the switching regulator is operated to allow for a large input-to-output conversion ratio. The time interval during which the over current monitoring is engaged becomes nearly non-existent due to circuit ringing and settling time issues. The track and latch comparator circuit 30 of the present invention, along with being fast and yet maintaining high gain is edge triggered and able to overcome the short time interval limitation problems.

The comparator 30 for over-current is also quite small, saving die area and cost and has virtually infinite gain and very high sensitivity, good even for small differential input voltage overdrives. Furthermore, the circuit is small enough for two of them to exist, to enhance the system algorithm to monitor over current problems, or even to open up possibilities to new system algorithms.

The comparator 30 is differential and thus very balanced from input to output; so, it won't have much of an offset due to an imbalanced architecture. For example, if folded-cascoded amplifiers are instead used for comparators like in some of the present products, making such architectures fully differential consumes die area; however, if they are not fully differential, offsets occur. Offsets that vary with input voltage or temperature disadvantageously lead to a varying comparator trip point.

First, monitoring the average value of the current for the purpose of aiding voltage regulation, instead of overcurrent checking, or second, normalizing the over current trip point are additional possibilities with two comparators of the present invention. For the second application, normally, it is very difficult to set an accurate trip point, one that is fairly constant. Two such small and fast comparators, may be used to calibrate/normalize the trip point.

All of these attributes of the present invention greatly enhances overall performance.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

One skilled in the art will recognize that the presented embodiments can be readily changed to use another polarity for example. Instead of N-type transistor inputs, P-type transistors may be used, and the subsequent polarity and timing control of the other transistors revised accordingly, pull-up transistors instead of pull-down, and so on. Also, instead of CMOS, bipolar or biCMOS processors may be used.

I claim:

1. A comparator adapted to provide over-current monitoring, comprising:
   a preamplifier stage having a first input adapted to receive and track a current sensing parameter, a second input adapted to receive a reference current trip point threshold parameter, and generating pair of current mirror outputs tracking the current sensing parameter as a function of a first control signal;
   a latch stage adapted to be selectively enabled by a second control signal;
   the preamplifier stage includes a pair of current mirror transistors for mirroring current to the latch stage; and
   the latch stage includes two pairs of receiving transistors, each pair to receive a respective current mirror output from the pair of current mirror outputs, wherein each pair are coupled to respective current mirror transistors of the pair of current mirror transistors, wherein said each pair of receiving transistors is precharged.

2. The comparator as specified in claim 1 wherein the preamplifier stage is adapted to be selectively disabled when the latch stage is enabled.

3. The comparator as specified in claim 1 wherein the preamplifier stage further comprises transistors adapted to be selectively enabled to source additional current when enabled.

4. The comparator as specified in claim 1 wherein the preamplifier stage further comprises transistors adapted to be selectively enabled to source additional current when enabled.

5. The comparator as specified in claim 1 wherein the first input is coupled to a first cascode transistor and the second input is coupled to a second cascode transistor, wherein the first and second cascode transistors are operable to be deactivated as cascodes.

6. The comparator as specified in claim 1 wherein the preamplifier stage have a pair of diode-connected load transistors, and a second pair of transistors coupled in parallel to the diode-connected load transistors, wherein the second pair of transistors is operable to disable the preamplifier or to increase the gain of the preamplifier.

7. A comparator adapted to provide over-current monitoring, comprising:
   a preamplifier stage having a first input adapted to receive and track a current sensing parameter, a second input adapted to receive a reference current trip point threshold parameter, and generating current outputs tracking the current sensing parameter as a function of a first control signal;
   a latch stage adapted to be selectively enabled by a second control signal and third control signal;
   the preamplifier stage includes current mirror transistors for mirroring the current outputs to the latch stage; and
   the latch stage includes receiving transistors coupled to respective current mirror transistors for receiving the current outputs,
   wherein said receiving transistors are precharged; and
   the latch stage is adapted to selectively latch the current outputs of the preamplifier stage, wherein the second and third control signals are selectively enabled independent of each other.

8. The comparator as specified in claim 7 wherein the preamplifier stage is adapted to be selectively disabled.

9. The comparator as specified in claim 7 wherein the preamplifier stage further comprises transistors adapted to be selectively enabled to source additional current when enabled.

10. The comparator as specified in claim 7 is part of a DC-DC switching converter.

11. The comparator as specified in claim 7 wherein the preamplifier stage comprises input transistors that are cascoded.

12. A comparator comprising:
    a preamplifier stage having a first input adapted to receive and track a current sensing parameter, a second input adapted to receive a reference current trip point threshold parameter, and generating current outputs tracking the current sensing parameter as a function of a first control signal;
    a latch stage receiving the current outputs and adapted to be selectively enabled by a second control signal;
    the preamplifier stage comprises current mirror transistors mirroring the current outputs to the latch stage; and
    wherein the latch stage includes receiving transistors coupled to the current mirror transistors of the preamplifier stage,
    the receiving transistors are pre-charged with current from the current outputs; and
    wherein the comparator is adapted to provide over-current monitoring.

13. The comparator as specified in claim 12 wherein the latch stage is a regenerative latch.

14. The comparator as specified in claim 12 is part of a DC-DC switching converter.

15. The comparator as specified in claim 12 wherein the preamplifier stage comprises input transistors that are cascoded.

16. The comparator as specified in claim 12 wherein the first input and second input are cascoded by optionally enabled transistors, whereby Miller capacitance is reduced.

17. A method of operating a current sensing comparator having a preamplifier and a latch responsively coupled to the preamplifier comprising the steps of:
   amplifying a difference between an input and a reference input with the preamplifier and generating current outputs by current mirroring transistors;
   mirroring the current outputs to receiving transistors of the latch;
   coupling said receiving transistors to the current mirroring transistors of the preamplifier;
   precharging the receiving transistors with the current outputs from the preamplifier; and
   enabling the latch selectively by two control signals to provide latch outputs, wherein the two control signals are selectively enabled independent of each other.

18. The method as specified in claim 17 further comprising the step of selectively disabling the preamplifier.

19. The method as specified in claim 17 further comprising the step of selectively pre-charging the latch prior to enabling the latch.

20. The method as specified in claim 17 wherein the latch is a regenerative latch.

21. The method as specified in claim 17 further comprising steps of switching the latch outputs and buffering switch outputs after the switching.

22. The method as specified in claim 17 is used in a DC-DC switching converter.

23. The method as specified in claim 17 comprising a further step of cascoding input transistors of the preamplifier stage.

* * * * *